United States Patent [19]

Gergis et al.

[11] 4,415,990
[45] Nov. 15, 1983

[54] COMPLEMENTARY BI-LEVEL MAGNETIC BUBBLE PROPAGATION CIRCUIT

[75] Inventors: Isoris S. Gergis, Yorba Linda; Wai-Tak P. Lee, Santa Ana, both of Calif.

[73] Assignee: Rockwell International Corporation, El Segundo, Calif.

[21] Appl. No.: 276,408

[22] Filed: Jun. 22, 1981

Related U.S. Application Data

[63] Continuation of Ser. No. 71,449, Aug. 31, 1979, abandoned.

[51] Int. Cl.³ ............................................. G11C 19/08
[52] U.S. Cl. ......................................... 365/41; 365/32
[58] Field of Search ....................... 365/32, 35, 36, 38, 365/39, 41, 42

[56] References Cited

U.S. PATENT DOCUMENTS 3,699,551  10/1972  Fischer .
3,988,722  10/1976  Keefe et al. .
4,086,661  4/1978  Matsuyama et al. .
4,283,775  8/1981  Cohen ................................. 365/41

OTHER PUBLICATIONS

IBM Technical Bulletin, vol. 18, No. 9, Feb. 1976, "Contiguous Bubble Domain Propagation Structures," M. S. Cohen.
"1-$\mu$m Bubble Permalloy Contiguous-Disk Devices'"—Journal of Applied Physics, vol. 52, No. 3, Mar. 1981, pp. 2374-2376.
IEEE Transactions on Magnetics-vol. MAG-15, No. 6, Nov. 1979; pp. 1654-1656.

*Primary Examiner*—James W. Moffitt
*Attorney, Agent, or Firm*—H. Fredrick Hamann; Daniel R. McGlynn

[57] ABSTRACT

A bi-level magnetic bubble domain propagation structure in which the domain guide structure is formed by a spatially periodic pattern of permalloy implemented on two discrete levels separated by a substantially vertical gap. The structure forms a pattern of contiguous disk on one level and the complementary image of such disks on the second level.

16 Claims, 7 Drawing Figures

COMPLEMENTARY BI-LEVEL MAGNETIC BUBBLE PROPAGATION CIRCUIT

The invention herein desribed was made in the course of or under a contract or subcontract thereof, with the Department of the Air Force.

This application is a continuation of application Ser. No. 071,449, filed Aug. 31, 1979 and now abandoned.

BACKGROUND OF THE INVENTION

1. Field of the Invention

The present invention relates to magnetic bubble domain devices, and in particular mask patterns or configurations of guide structures for the propagation of magnetic bubble domains.

2. Description of the Prior Art

There are various known devices and propagation structures which provide means for propagating magnetic bubble domains on a layer of material. One of the most important of such arrangements for propagation of bubbles is the so called "field access" configuration which utilizes specifically shaped elements of a magnetic material (typically permalloy), which when subjected to a rotation or reorienting drive magnetic field parallel to the plane of the layer of magnetic material supporting the bubbles, typically a layer of magnetic garnet. produces a propagating series of potential wells in the layer which causes the bubble or bubbles present therein to propagate synchronously with the potential wells. Additional bias field is also typically provided normal to the magnetic layer of material to stabilize the bubbles. The rotating magnetic field usually consists of a magnetic field rotating about an axis parallel to the bias field.

The fabrication of circuits for the propagation of magnetic bubble domains has used most of the same fabrication techniques as is employed in integrated circuits, such as the selective deposition and/or etching of material through masks of desired patterns. One of the basic limitations of the density of the magnetic bubble devices is the size of the field propagating elements or patterns themselves, which is dependent upon the lithographic resolution of the fabricating process.

Over the last few years, bubble propagation patterns have evolved from the basic T-I bar structure that requires a resolution of about 1:16, to the present "state-of-the-art" gap tolerant patterns such as the asymmetric chevron in which the resolution is about 1:8. The resolution is defined as the ratio between the minimum feature size to the circuit period length. With the photolithographic resolution at about 1 $\mu$m minimum feature a bit density of about $10^6$ bits/cm$^2$ is presently achieved, using the gap tolerant pattern.

To achieve lower device cost through higher bit density it is necessary to employ propagation patterns having a lower resolution. Some of the approaches that are being developed are the ion-implanted propagation pattern ($I^2P^2$), also known as contiguous disk, and the lattice file. The $I^2P^2$ approach promises a resolution of less than 1:4, thus quadrupling the present bit density. However, the $I^2P^2$ devices presently have a number of disadvantages. The development of some of the essential device functions, such as the detector in $I^2P^2$ devices has not been satisfactorily concluded. The bubble lattice file has the potentiality of $10^7$ bits/cm$^2$, but requires very complex processing, therefore making such devices prohibitively expensive.

Another configuration also using a contiguous disk arrangement is shown in U.S. Pat. No. 4,151,606, although such an arrangement is applied to the propagation of inverted Neel wall sections instead of magnetic bubbles. The disadvantage of such technology is that the application of bubble devices to digital data storage requires redundancy to ensure reliability, which is not easily implemented.

Prior to the present invention there has not been a high density, permalloy magnetic bubble domain guide structure that is easily fabricated.

SUMMARY OF THE INVENTION

Briefly, and in general terms, the invention is concerned with a magnetic bubble domain propagation structure, and in particular with a bi-level structure in which a bubble domain propagates along a guide structure defined by both an upper and a lower layer of magnetic material.

The magnetic bubble domain propagation structure according to the present invention provides a layer of magnetic material in which magnetic bubble domains can be propagated, including a bubble domain guide structure on said layer which comprises magnetic elements, including an upper first layer of magnetic material, and a lower second layer of magnetic material in which the second layer is separated from the first layer by a substantially vertical wall.

The guide structure according to the present invention achieves a resolution of 1:5 or less, and moreover has the advantage of using a permalloy pattern for bubble propagation. The use of permalloy therefore allows the use of the magnetoresistive effect in the permalloy for bubble detection. This is in contrast to the $I^2P^2$ devices where, presumably, an additional magnetoresistive layer must be incorporated into the device for detection.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

Figure 1:
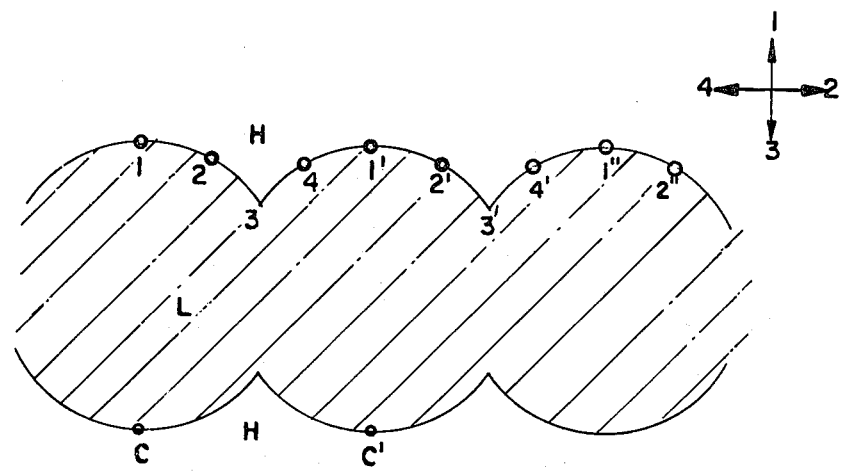
FIG. 1 is a top plan view of the guide structure for a magnetic bubble domain propagating circuit according to the present invention.

FIG. 1 is a top plan view of the guide structure for the bubble domain propagating circuit according to the present invention. Only a portion of the guide structure of contiguous disks is shown in the FIGURE, but is must be realized that the entire guide structure extends in both the horizontal and the vertical direction from the portion shown in the FIGURE.

The bubbles propagate in a horizontal direction with respect to the portion shown in the FIGURE, as will be explained subsequently. The pattern in the horizontal direction is a periodic one, with the contiguous disks repeating themselves. The arrows labeled "1", "2", "3", and "4" represent the directions of the magnetic field at different times.

For successful bubble propagation along a periodic guide structure pattern, two conditions have to be satisfied:

i. A localized region of lower bias field (i.e. a potential energy well) should be present at all phases of the drive field.

ii. The potential energy well formed in the layer of magnetic material on which bubble domains can be propagated should be able to be continuously and coherently translated by the guide structure.

These two conditions are met in the conventional guide structure composed of discrete elements, such as the half disk pattern (not shown). The potential energy well moves around the periphery of the half disk during one-half of a field cycle, and then becomes localized under the legs of two adjacent discrete elements. In such a position it provides an elongated channel in which the bubble can jump the gap between the two elements. In continuous planar permalloy pattern (i.e. a gapless circuit) such as the contiguous disk pattern according to the prior art, the condition (ii) above is not satisfied.

The violation of condition (ii) in the prior art continuous, planar permalloy pattern can be seen by considering the magnetic polarization of such a guide structure under the influence of a rotating field. With the field pointing "up" (i.e., in the direction of the arrow labeled "1") a potential well occurs at points 1, 1', 1'', etc. on the guide structure. During phase 2 (i.e., when the magnetic field is in the direction of the arrow labeled "2"), these wells translate to points 2, 2', 2'', etc.. During phase 3, however, no appreciable pole exists at points 3, 3', since such points are at a concave, rather than a convex portion of the guide structure. In fact, the magnetic charge at such points 3, 3', is likely to be repulsive rather than attractive to bubbles. Thus, a bubble transported to such a position either collapses or jumps to points C, C' and, in effect, rotates around each individual disk synchronously with the rotation of the external magnetic field.

The guide pattern according to the present invention cosists of two spaced apart magnetic layers, the upper first layer being labelled H in the figure, and a lower second layer being labelled L in the figure and shaded with diagonal lines so as to distinguish from the H layer. The boundary between the upper layer and the lower layer is formed by a substantial vertical gap so that the actual layers of magnetic material are actually spaced apart and disconnected from one another in the preferred embodiment.

The guide structure according to the present invention does satisfy condition (ii) and thereby overcomes the disadvantage of the conventional contiguous disk pattern. The guide structure uses the one portion of a complementary permalloy pattern (i.e. the portion defined by the level area labeled "H" in FIG. 1) to provide the potential energy well during the field phase in which contiguous disk pattern L does not provide adequate supporting field to the bubble. Of course, the two patterns H and L are spatially complementary to one another when viewed from a top plan view as shown in FIG. 1, (i.e., every point on the surface of the guide structure is either on the H pattern, or the L pattern, but never both). The two patterns H and L have to be sufficiently separated from each other in the vertical direction by a physical gap so as not to magnetically short one another. This is achieved according to the present invention by placing the H and L patterns at two different levels (in other words, separated by a substantially vertical gap) as illustrated in the cross-sectional view of FIG. 2. In effect the discontinuity along the boundary between the two patterns creates a fringing field due to the abrupt change in the permalloy flux, which in turn drives the bubble. The guide structure according to the present invention has low lithographic resolution (i.e. 1:5 or less) and hence high storage density. Moreover, the requisite propagation field is generated at the step boundary between the complementary elements.

Another important advantage of the configuration according to the present invention is that it minimizes the number of masks necessary to define the required patterns. Only a single mask is necessary to define all initial patterns in the present configuration.

In the contiguous disk configuration shown in FIG. 1, the disks are preferably the same radius R, and overlap by a distance less than R/4. Moreover, the center of the contiguous disks lie along a substantially straight line.

Figure 2:
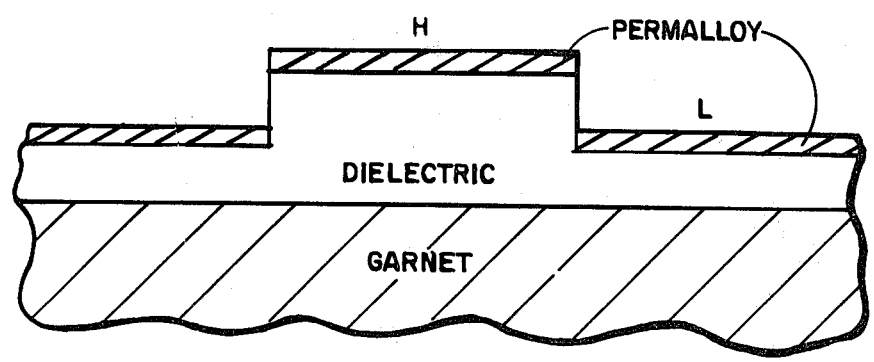
FIG. 2 is a cross-sectional view through the 2-2 plane in FIG. 3 structure in a magnetic bubble domain propagating circuit.
Figure 3:
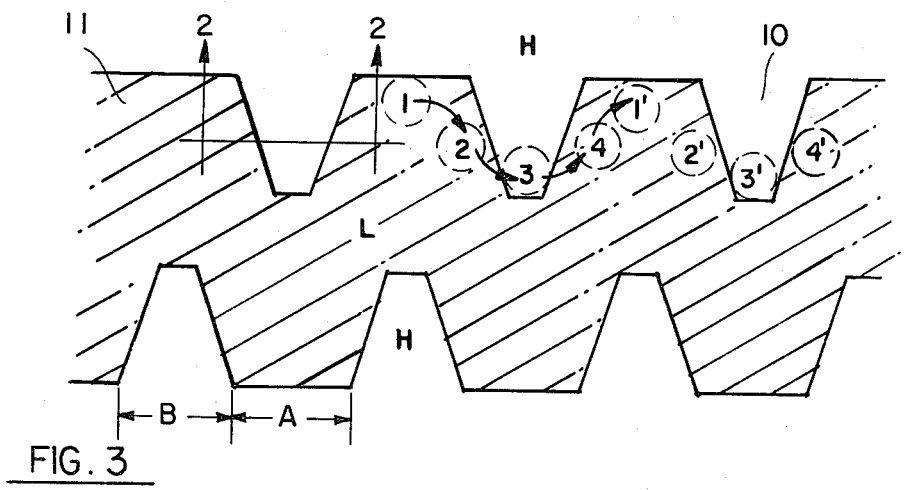
FIG. 3 is a top plan view of an alternative embodiment of the guide for a magnetic bubble propagating circuit according to the present invention.

FIG. 2 is a cross-sectional view of the magnetic bubble domain propagation circuit and guide structure as taught by the present invention through the 2—2 plane of FIG. 3. The lowr portion of FIG. 2 shows a first magnetic layer, preferably composed of garnet. The magnetic garnet layer is capable of supporting and propagating a plurality of magnetic bubble domains, as is known in the prior art. Below the magnetic garnet layer is a non-magnetic substrate (not shown) such as of non-magnetic garnet, which is provided for increasing the physical strength of the entire structure.

On the major surface of the garnet layer shown in FIG. 2 is disposed a layer of a dielectric material such as sillicon dioxide. The dielectric is typically silox and is deposited on the major surface of the garnet layer by a known technique. The dielectric forms a two-level surface which is marked either as the high level ("H") or as the low level ("L") portion.

Disposed on the top surface of the dielectric is a thin layer of permalloy material. The permalloy material deposited on the low area marked by an "L" is separated by a substantially vertical gap from the permalloy deposited on the higher dielectric surface marked by an "H". Since the upper and lower permalloy layers are physically separated by a vertical gap composed of dielectric material, the upper and lower permalloy layers are magnetically isolated from one another.

FIG. 3 is a top plan view of an alternative embodiment of the guide structure for a magnetic bubble propagation device according to the present invention. Just as in FIGS. 1 and 2, the relatively high layer 10 is labeled by the letter "H" and the relatively low layer 11 is labeled by the letter "L".

The configuration of FIG. 3 is a portion of a bubble domain device showing a linear strip having trapezoidal indentations along the edges. The trapezoidal indentation extends from the edge of the linear strip in a normal direction towards the center of the strip, a distance equal to approximately ⅓ of the width of the strip. The trapezoidal indentations are approximately the same size. Moreover, the distance A between the trapezoidal indentations is greater than the length B of the base of the trapezoid, and is preferably three times as large as the base of the trapezoid, i.e. the distance A is preferably three times that of B shown in FIG. 3.

To illustrate how a bubble propagates along the pattern shown in FIG. 3, we first note that the layer L is closer to the garnet than layer H, and thus should have stronger coupling to the bubble. During the field phase 4→1'→2', the bubble propagates around the square edge 4→1'→4' under the influence of the field created by layer L. Somewhere between phases 2' and 3', the bubble should cross the boundary to the H side as the pole at point 3' becomes stronger than the poles on layer L. Between phases 3' and 4+, the bubble is attracted back to layer L and the cycle is repeated and results in a coherent translation along the pattern. The path of the bubbles are now represented by the numerals 1, 2, 3, 4, 1', 2', 3', 4+, etc. indicating how a magnetic bubble present on the magnetic garnet substrate underneath the guide structure originally located at position 1 when the magnetic field is pointed in the position indicated by the arrow 1 in FIG. 1 would traverse the guide structure as the magnetic field rotates in a clockwise direction as suggested by the sequence of positions 1, 2, 3, 4, 1, 2, 3, 4, etc. The low area is cross-hatched not to indicate any different composition from the high area but merely to more pictorially distinguish the low level from the high level.

It must be realized that the periodic structure shown in FIG. 3 is only one out of a variety of similar patterns. A key feature of such patterns is that there is sufficient assymmetry in the pattern to enhance the directionality of the bubble motion in favor of the direction dictated by the magnetic fields generated by the layer L. In configurations which are more symmetrical (e.g. a configuration in which the trapezoid cut in the L layer would be the same size as the trapezoid cut into the H layer) would not be effective, since the two layers L and H would be competing with each other to drive the bubble in opposite directions under the influence of an external magnetic field. Thus in such a symmetrical case marginal bubble propagation is hardly possible.

Figure 4A:
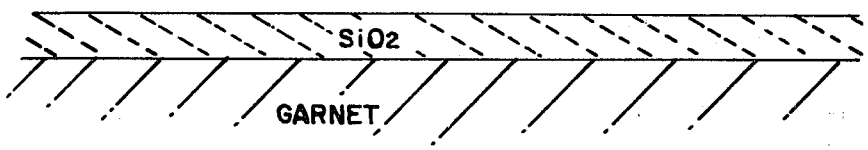
FIG. 4a shows a first step in the fabrication process of the magnetic bubble domain propagating structure according to the present invention, showing a cross-section of a garnet substrate with a silicon dioxide layer thereover.
Figure 4B:
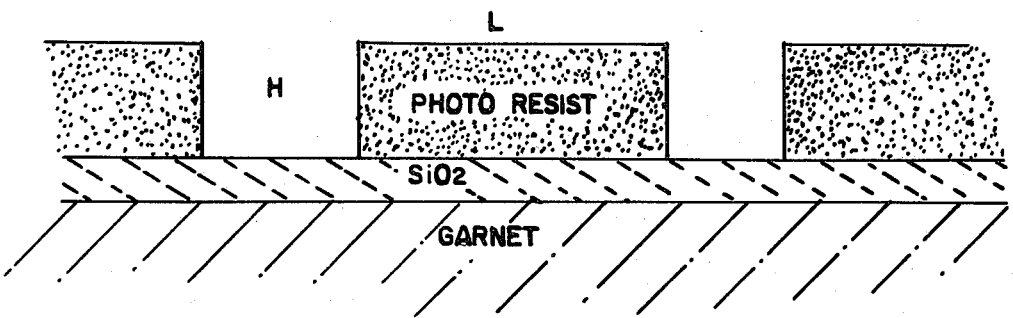
FIG. 4b is a second step in the fabrication process according to the present invention, showing a mask layer of photoresist applied over the silicon dioxide surface according to a predetermined pattern.

Turning now to FIG. 4 which is comprised of a sequence of FIGS. 4a through 4d, there is shown the technique of fabricating a bi-level device according to the present invention. Turning first to FIG. 4a there is shown a layer of silicon dioxide $SiO_2$ deposited on a garnet substrate. Such a layer will later function as the spacer for the layer "L". A photoresist layer patterned according to a specific mask is then deposited on top of the $SiO_2$ layer, as shown in FIG. 4b, using techniques known in the art.

Figure 4C:
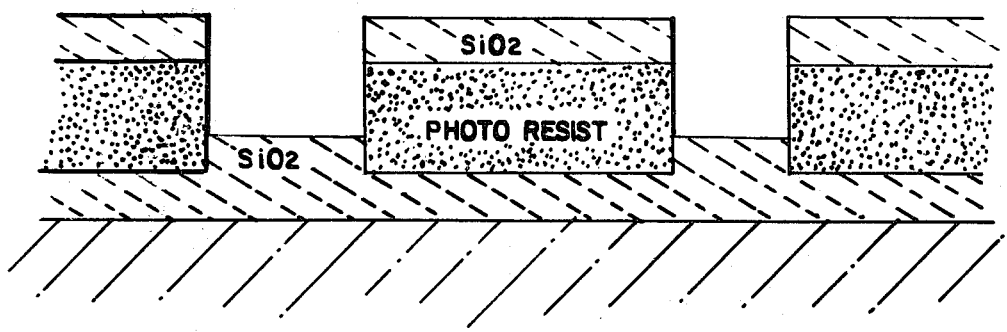
FIG. 4c is a third step in the fabrication process, showing a deposition of a layer of SiO$_2$ or other suitable dielectric over the photoresist, which is followed by a lift-off process which removes the photoresist and the SiO₂ from specific areas.
Figure 4D:
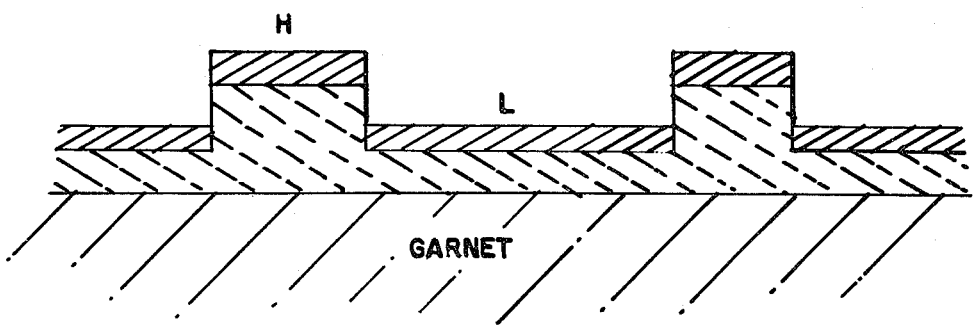
FIG. 4d is the final step in the fabrication process showing the deposition of a permalloy layer over the entire surface of the wafer.

The next step is the deposition of an additional layer of $SiO_2$ over the entire wafer, that is, over the photoresist layer in the portion of the wafer designated as "L", as well as over the $SiO_2$ layer already existing in the portion of the wafer designated as "H". This deposition of $SiO_2$ results in a structure which is shown in FIG. 4c.

Following the deposition of the $SiO_2$, a lift-off process then removes the photoresist as well as the $SiO_2$ from the areas designated by "L" on the wafer. The resulting structure is a relatively high area of $SiO_2$ in the regions designated by the letter "H" and a relatively low area of $SiO_2$ in an area designated by the letter "L". On such a configuration a layer of permalloy is deposited resulting in the structure shown in FIG. 4d. The relative thickness of the $SiO_2$ and the permalloy layer are such that a discontinuity remains between the high and low levels of the permalloy layer so that such layers are magnetically isolated from one another.

While the invention has been illustrated and described as embodied in a bi-level magnetic bubble propagation circuit and method of fabrication, it is not intended to be limited to the details shown, since various modifications and structural changes may be made without departing in any way from the spirit of the present invention.

It will be obvious to those skilled in the art that the magnetic bubble device according to the present invention can be manufactured with various lithographic technologies and different combinations of known process steps, and that the preferred embodiments illustrated here are merely exemplary. The configuration and distance between the guide elements, as well as their distance to the magnetic bubble layer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example various crystalline compounds, may be used. Moreover, the orientation of the magnetic field and the static or dynamic nature of the signals applied to the device, may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A magnetic bubble domain device comprising:
   a planar layer of magnetic material in which magnetic bubble domains can be propagated;
   a bubble domain guide structure coupled to said layer for defining a bubble propagation path for guiding the movement of said bubbles in said layer in response to a cyclical change in the orientation of a reorienting magnetic field within the plane of said layer;
   said structure comprising a two-level composite structure including a first pattern of elements responsive to a magnetic field formed as an upper first layer of said structure, and a second pattern of elements responsive to a magnetic field forming a lower second layer of said structure, said first and said second patterns being complementary to each other, said first and second layers being separated by a substantially vertical gap;

said first and second second pattern of elements being operative in response to a rotating field so as to form a potential energy well in said layer of magnetic material in which magnetic bubble domains can be propagated underneath said layers of said guide structure so that as the magnetic field reorients in the plane of the layer, the potential well is translated in said layer of magnetic material in a direction along a path corresponding to the path in the plane of said guide structure of the vertical gap between said upper first layer and said lower second layer.

2. A device as defined in claim 1 wherein said bubble domains are propagated underneath said upper layer during a first portion of the timing cycle of the reorienting magnetic field, and propagated underneath said lower layer during a second subsequent portion of the timing cycle of the reorienting magnetic field.

3. A device as defined in claim 1, wherein said first and second layer of magnetic material comprises permalloy.

4. A device as defined in claim 1, wherein said guide structure is formed as a continuous, spatially periodic structure.

5. A device as defined in claim 1, wherein said second pattern is a sequence of overlapping contiguous disks.

6. A device as defined in claim 5, wherein the center of said disks lie along a substantially straight line.

7. A device as defined in claim 5, wherein said disks are approximately the same radius.

8. A device as defined in claim 7, wherein said disks overlap by a distance equal to less than R/4, wherein R is the radius of said disks.

9. A device as defined in claim 1, wherein said substantially vertical gap is filled with a dielectric material.

10. A device as defined in claim 9, wherein said dielectric material is silicon dioxide.

11. A device as defined in claim 1, wherein said second pattern is a substantially linear strip having concave trapezoidal indentations along the edges.

12. A device as defined in claim 11, wherein the trapezoidal indentation extends from the edge of said linear strip in a normal direction towards the center of the strip a distance equal to approximately $\frac{1}{3}$ of the width of the strip.

13. A device as defined in claim 11, wherein said trapezoidal indentations are approximately the same size.

14. A device as defined in claim 11 wherein the distance between the trapezoidal indentations is greater than the length of the base of the trapezoid.

15. A device as defined in claim 14 wherein the distance between the trapezoidal indentations is approximately three times as large as the base of the trapezoid.

16. A magnetic bubble domain device comprising:

a planar layer of magnetic material in which magnetic bubble domains can be propagated;

a bubble domain guide structure disposed on one side of said layer and coupled to said layer for defining a bubble propagation path for guiding the movement of said bubbles in said layer in response to a cyclical change in the orientation of a reorienting magnetic field within the plane of said layer;

said structure comprising a two-level composite structure including a first pattern of elements responsive to a magnetic field formed as an upper first layer of said structure, and a second pattern of elements responsive to a magnetic field forming a lower second layer of said structure, said first and said second patterns being complementary to each other, said first and second layers being separated by a substantially vertical gap;

said first and second pattern of elements being operative in response to a rotating field so as to form a potential energy well in said layer of magnetic material in which magnetic bubble domains can be propagated underneath said layers of said guide structure so that as the magnetic field reorients in the plane of the layer the potential well is translated in said layer of magnetic material alternately underneath said upper first layer and said lower second layer.

* * * * *

UNITED STATES PATENT AND TRADEMARK OFFICE
CERTIFICATE OF CORRECTION

PATENT NO. : 4,415,990
DATED : November 15, 1983
INVENTOR(S) : Isoris S. Gergis et al It is certified that error appears in the above-identified patent and that said Letters Patent are hereby corrected as shown below:

In column 4, line 45, please delete "lowr" and insert --lower--.

In column 5, line 28, please delete "4+" and insert --4´--.

In column 5, line 32, please delete "4+" and insert --4´--.

Signed and Sealed this

Twenty-fourth Day of April 1984

[SEAL]

Attest:

Attesting Officer

GERALD J. MOSSINGHOFF

Commissioner of Patents and Trademarks